(12) United States Patent
Kim et al.

(10) Patent No.: US 7,157,960 B2
(45) Date of Patent: Jan. 2, 2007

(54) APPARATUS AND METHOD FOR STABILIZING A BOOSTED VOLTAGE, APPARATUS AND METHOD FOR GENERATING A BOOSTED VOLTAGE HAVING THE SAME

(75) Inventors: Sung-Eun Kim, Daejeon (KR); Sun-Young Kim, Daejeon (KR); Jin-Kyung Kim, Daejeon (KR); Seong-Jun Song, Daejeon (KR); Hoi-Jun Yoo, Daejeon (KR)

(73) Assignee: Samsung Electronics Co., Ltd. (KR)

( * ) Notice: Subject to any disclaimer, the term of this patent is extended or adjusted under 35 U.S.C. 154(b) by 92 days.

(21) Appl. No.: 10/996,694

(22) Filed: Nov. 23, 2004

(65) Prior Publication Data

US 2005/0110560 A1    May 26, 2005

(30) Foreign Application Priority Data

Nov. 24, 2003    (KR) .......................... 10-2003-83433

(51) Int. Cl.
*G05F 1/10*    (2006.01)
*G05F 3/02*    (2006.01)

(52) U.S. Cl. .................................................. 327/536
(58) Field of Classification Search ................ 327/534, 327/535, 536, 537; 363/59–60
See application file for complete search history.

(56) References Cited

U.S. PATENT DOCUMENTS

| 5,027,053 | A | * | 6/1991 | Ohri et al. ................... 323/314 |
| 6,198,341 | B1 | * | 3/2001 | Ryu ............................ 327/536 |
| 6,275,096 | B1 | * | 8/2001 | Hsu et al. .................... 327/535 |
| 6,297,687 | B1 | * | 10/2001 | Sugimura .................... 327/536 |
| 6,329,869 | B1 | * | 12/2001 | Matano ....................... 327/536 |
| 6,532,177 | B1 | * | 3/2003 | Butler ..................... 365/189.09 |
| 6,744,224 | B1 | * | 6/2004 | Ishii ........................... 315/291 |
| 6,791,212 | B1 | * | 9/2004 | Pulvirenti et al. .......... 307/113 |
| 6,798,274 | B1 | * | 9/2004 | Tanimoto .................... 327/536 |
| 2004/0246044 | A1 | * | 12/2004 | Myono et al. .............. 327/536 |

\* cited by examiner

*Primary Examiner*—Quan Tra
(74) *Attorney, Agent, or Firm*—Mills & Onello LLP

(57) ABSTRACT

An apparatus for stabilizing a boosted voltage includes a voltage detector, a buffer driver control unit and a buffer driver. The voltage detector detects a change in a level of a boosted voltage and outputs first through N-th detection signals corresponding to the detected change, the boosted voltage being generated to have a higher voltage level than a power supply voltage level in response to a clock signal. The buffer driver control unit generates first through 2N-th current control signals based on the first through N-th detection signals. The buffer driver includes first through N-th inverter drivers that selectively operate based on the first through 2N-th current control signals, thereby modulating a charging current for generating the boosted voltage. Hence, the boosted voltage having a constant level and a reduced ripple may be generated.

28 Claims, 7 Drawing Sheets

APPARATUS AND METHOD FOR STABILIZING A BOOSTED VOLTAGE, APPARATUS AND METHOD FOR GENERATING A BOOSTED VOLTAGE HAVING THE SAME

CROSS REFERENCE TO RELATED APPLICATION

This application claims priority under 35 USC § 119 to Korean Patent Application No. 2003-83433, filed on Nov. 24, 2003, the contents of which are herein incorporated by reference in their entirety for all purposes.

BACKGROUND OF THE INVENTION

1. Field of the Invention

The present invention relates to an apparatus and a method for stabilizing a boosted voltage. More particularly, the present invention relates to an apparatus and a method for stabilizing a boosted voltage, for generating a stabilized boosted voltage without affect from a load variance.

2. Description of the Related Art

In a device such as a Universal Serial Bus (hereinafter, referred to as USB), an additional power line is required apart from data lines that transmit data between USB devices. Generally, in USB communication, a computer performs as a host, and a mobile device performs as a peripheral and the computer and the mobile device communicate with each other through a power line provided from the host computer. However, as the market of the mobile device or the peripheral device becomes larger, communications therebetween becomes more significant. The communications between the mobile devices or the peripheral devices are implemented by USB-On-The-Go (USB-OTG) technology, in which the mobile devices or peripheral devices perform both as a host and a peripheral device without aid from the host computer. Therefore, the mobile devices or peripheral devices should provide a power line in place of the host computer.

In addition, since a power supply voltage level has been decreased as manufacturing technology is developed while a voltage in USB communication provision is established based on prior art, a voltage level used in the USB communication is higher than the power supply voltage level used today.

Therefore, boosting the power supply voltage is essential to drive a power line in the mobile device or the peripheral device. Although a charge pump has been developed recently and utilized as a power supply source in the mobile devices, it is not satisfactory in a current driving capability or in a stable power supply.

SUMMARY OF THE INVENTION

The present invention is directed to an apparatus for stabilizing a boosted voltage. The apparatus for stabilizing a boosted voltage includes a voltage detector, a buffer driver control unit and a buffer driver. The voltage detector detects a change in the level of a boosted voltage and outputs first through N-th detection signals corresponding to the detected change, wherein the boosted voltage is generated to have a higher voltage level than a power supply voltage level in response to a clock signal. The buffer driver control unit generates first through 2N-th current control signals based on the first through N-th detection signals. The buffer driver includes first through N-th inverter drivers that are configured to be selectively operated to modulate a charging current for generating the boosted voltage, based on the first through 2N-th current control signals.

In one embodiment, the voltage detector includes: a reference voltage generator for generating a reference voltage; first through (N+1)-th resistors for dividing the boosted voltage to generate first through N-th divided voltages; and first through N-th comparators for comparing the first through N-th divided voltages with the reference voltage to output the first through N-th detection signals.

In one embodiment, the first through 2N-th current control signals include first through N-th NMOS control signals and first through N-th PMOS control signals, and the first through N-th PMOS control signals correspond to the first through N-th NMOS control signals, respectively. In one embodiment, the first through N-th NMOS control signals are reversed signals of the corresponding first through N-th PMOS control signals. In one embodiment, the buffer driver control unit includes: a first inverting unit configured to invert and amplify the first through N-th detection signals; a first control signal output unit configured to output the first through N-th NMOS control signals in response to the first through N-th detection signals that are inverted by the first inverting unit; a second inverting unit configured to secondly invert the inverted first through N-th detection signals; and a second control signal output unit configured to output the first through N-th PMOS control signals in response to the first through N-th detection signals that are secondly inverted by the second inverting unit. In one embodiment, the first control signal output unit includes: first through N-th NAND gates configured to provide a logical NAND of the inverted first through N-th detection signals and the clock signal; and first through N-th inverters configured to invert output signals of the first through N-th NAND gates to output the first through N-th NMOS control signals. In one embodiment, the second control signal output unit includes: first through N-th NOR gates configured to provide a logical NOR of the again inverted first through N-th detection signals and the clock signal; and first through N-th inverters configured to invert output signals of the first through N-th NAND gates, thereby outputting the first through N-th NMOS control signals.

In one embodiment, the buffer driver includes a first inverter configured to operate synchronously with the clock signal and output a first charging current, and the first through N-th inverter drivers are selectively operated in response to the first through 2N-th current control signals to selectively output second through N+1-th charging currents. In one embodiment, the first inverter includes: a first transistor having a gate terminal to which the clock signal is applied and a source terminal to which the power supply voltage is applied, and a drain terminal that is configured to output the first charging current; an a second transistor having a gate terminal to which the clock signal is applied, source terminal connected to a ground and a drain terminal connected to a drain terminal of a PMOS transistor. In one embodiment, the first through N-th inverter driver includes: first through N-th PMOS transistors having gate terminals to which the first through N-th PMOS control signals are applied, respectively, and source terminals to which the power supply voltage is applied, and configured to selectively operate in response to the first through N-th PMOS control signals to output the second through N+1-th charging currents through drain terminals thereof, respectively; and first through N-th NMOS transistors having gate terminals to which the first through N-th NMOS control signals are applied, respectively, and source terminals that are grounded, and drain terminals that are connected to corresponding drain terminals of the first through N-th PMOS transistors.

In one embodiment, N is 4.

In one embodiment, the apparatus of the invention further including a frequency multiplier for modulating a frequency of the clock signal. In accordance with another aspect, the invention is directed to an apparatus for stabilizing a boosted voltage. The apparatus includes a boosted voltage generator, a voltage detector, a buffer driver control unit and a buffer driver. The boosted voltage generator outputs a boosted voltage higher than a power supply voltage in response to a clock signal. The voltage detector detects a change in the level of the boosted voltage and outputs first through N-th detection signals according to the detected change. The buffer driver control unit outputs a first through 2N-th current control signals based on the first through N-th detection signals. The buffer driver includes first through N-th inverter drivers that are configured to operate selectively in response to the first through 2N-th current control signals, thereby modulating a charging current that is applied to the boosted voltage generator.

In one embodiment, the boosted voltage generator includes: a first capacitor configured to be charged to the boosted voltage when the first clock signal is high; a switch transistor configured to be turned on when the first clock signal is low, and configured to output the charged boosted voltage of the first capacitor; a second capacitor configured to maintain a turned-off state of the switch transistor when the first clock signal is high; first and second diodes configured to apply the power supply voltages to the first and second capacitors, respectively.

In one embodiment, the first and second diodes correspond to diode-connected PMOS transistors.

In accordance with another aspect, the present invention is directed to a method of stabilizing a boosted voltage. In accordance with the method, a change in the level of the boosted voltage is detected and first through N-th detection signals are outputted according to the detected change, wherein the boosted voltage is generated to have a higher voltage level than a power supply voltage level based on a clock signal. A first through 2N-th current control signals are outputted based on the first through N-th detection signals. A charging current for generating the boosted voltage is modulated in response to the first through 2N-th current control signals.

In one embodiment, the detecting the change in the level of the boosted voltage includes: generating first through N-th divided voltages by dividing the boosted voltage; and outputting the first through N-th detection signals by comparing the first through N-th divided voltages with a predetermined reference voltage.

In one embodiment, the first through 2N-th current control signals include first through N-th NMOS control signals and first through N-th PMOS control signals, and the first through N-th PMOS control signals are inverted signals of the corresponding first through N-th NMOS control signals.

In one embodiment, outputting the first through 2N-th current control signals includes: inverting and amplifying the first through N-th detection signals; and outputting the first through N-th NMOS control signals in response to the inverted first through N-th detection signals, and secondly inverting the inverted first through N-th detection signals to output the first through N-th PMOS control signals in response to the secondly inverted first through N-th detection signals. In one embodiment, the charging current is modulated by selectively outputting first through N+1 th charging currents in response to the first through N-th NMOS control signals and the first through N-th PMOS control signals.

In one embodiment, the method further comprises modulating a frequency of the clock signal.

In accordance with another aspect, the present invention is directed to a method of generating a boosted voltage. In accordance with the method, the boosted voltage higher than a power supply voltage is outputted by a clock signal. A change in the level of the boosted voltage is detected and first through N-th detection signals are outputted according to the detected change. First through 2N-th current control signals are outputted based on the first through N-th detection signals. A charging current applied to a generator of the boosted voltage is modulated in response to the first through 2N-th current control signals.

In one embodiment, the method further comprising modulating a frequency of the clock signal.

In accordance with another aspect, the invention is directed to a boost circuit comprising: a first charge pump configured to pump up a first node in response to a first clock signal; a second charge pump configured to have a current driving capability that varies depending on a feedback signal, and configured to pump up a second node in response to a second clock signal, the second clock signal being an inverted signal of the first clock signal; an output switch configured to switch an output capacitor by a charged voltage signal in the second node in response to a voltage signal of the first node; a voltage stabilizing unit configured to generate the feedback signal while increasing the capacitor voltage when the capacitor voltage is lower than a reference level, or decreasing the capacitor voltage when the capacitor voltage is higher than the reference level.

In one embodiment, the first charge pump includes: a first inverter for inverting a clock signal; a p+/n– diode connected between a power supply voltage and the first node; and a capacitor connected between the first node and an output terminal of the first inverter. In one embodiment, the second charge pump includes: a second inverter for inverting a clock signal that is inverted by the first inverter; a p+/n– diode connected between the power supply voltage and the second node; a capacitor connected between the second node and an output terminal of the second inverter; and a buffer driver connected to the output terminal the second inverter, and having a current driving capability that varies depending on the feedback signal. In one embodiment, the buffer driver includes: a plurality of PMOS transistors connected between the power supply voltage and the output terminal of the second inverter in parallel, and configured to turn on to a thermometer code in response to a first feedback signal; and a plurality of NMOS transistors connected between a ground voltage and the output terminal of the second inverter in parallel, and configured to turn on to a thermometer code in response to a second feedback signal. In one embodiment, the voltage stabilizing unit includes: a voltage detector configured to detect the capacitor voltage by a plurality of detection signals; a first signal generator configured to generate a first feedback signal that is synchronized to the inverted clock signal, in response to the plurality of detection signals; and a second signal generator configured to generate a second feedback signal that is synchronized to the inverted clock signal, in response to the plurality of detection signal.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention. In the drawings, the sizes and the thicknesses of layers and regions are exaggerated for clarity.

DESCRIPTION OF THE EXEMPLARY EMBODIMENTS

Figure 1:
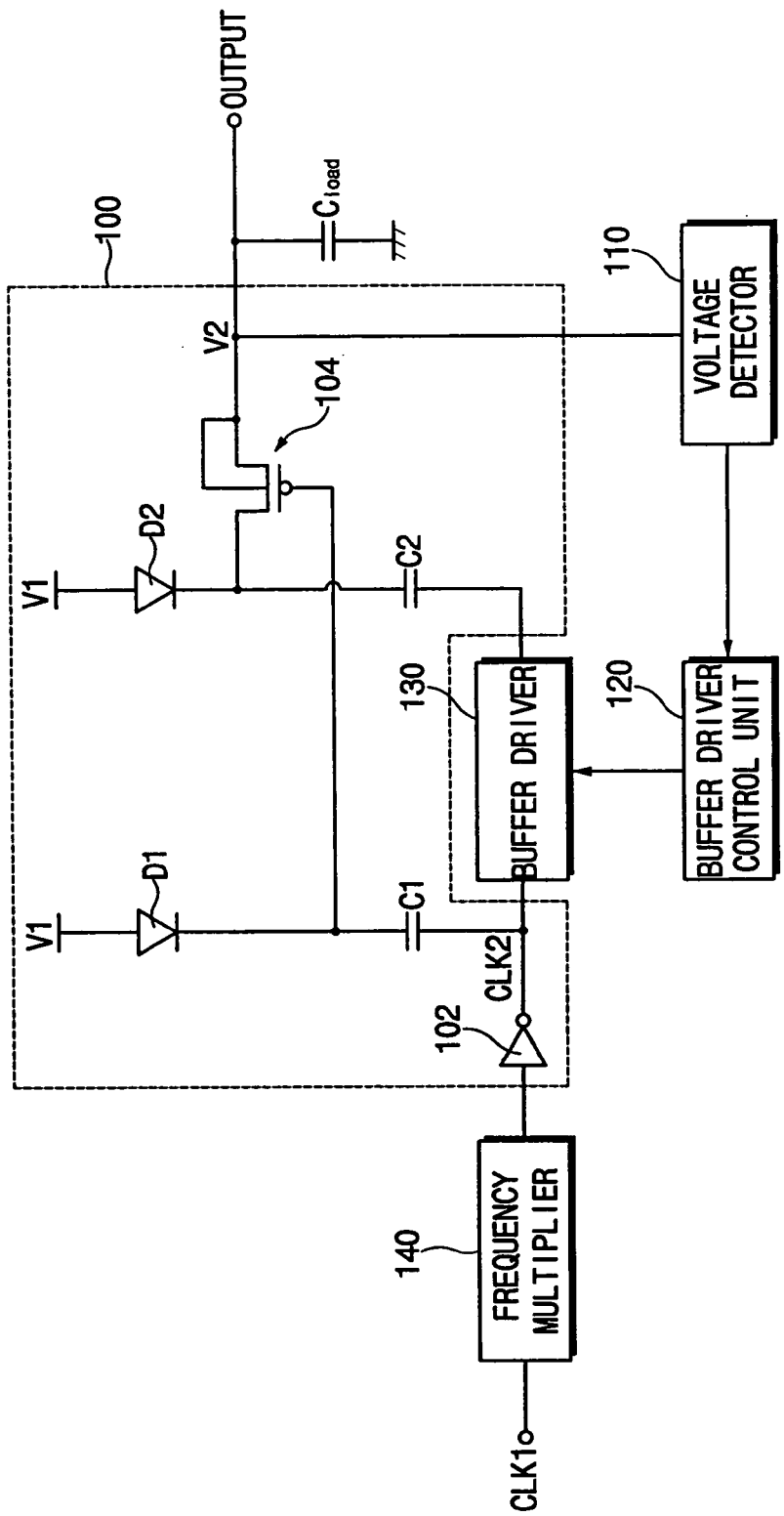
FIG. 1 is a schematic block diagram illustrating an apparatus for generating a boosted voltage according to an embodiment of the present invention.
Figure 2:
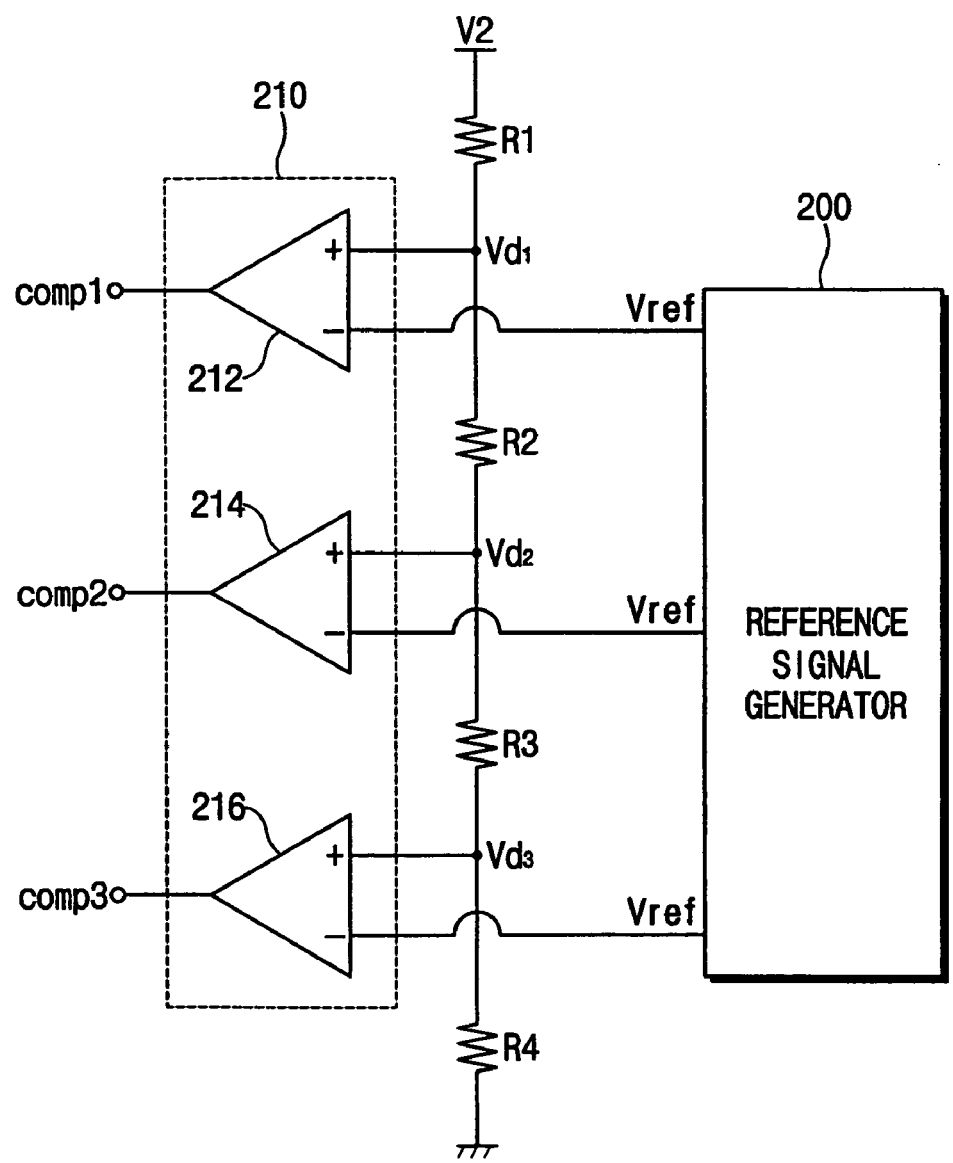
FIG. 2 is a detailed circuit diagram illustrating the voltage detector of FIG. 1.
Figure 3:
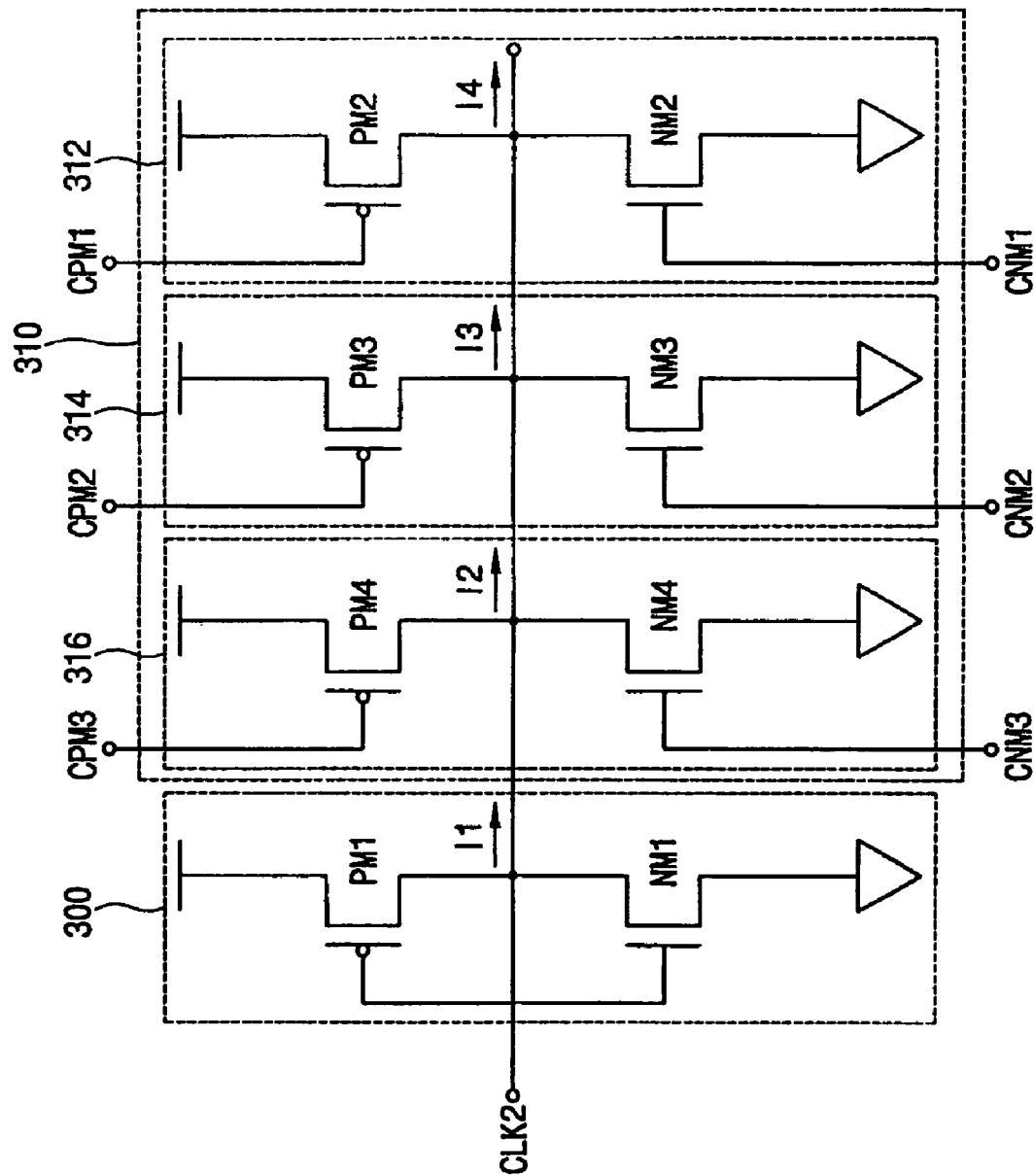
FIG. 3 is a detailed circuit diagram illustrating the buffer driver of FIG. 1.

FIG. 1 is a schematic block diagram illustrating an apparatus for generating a boosted voltage according to an embodiment of the present invention. FIG. 2 is a detailed circuit diagram illustrating the voltage detector of FIG. 1. FIG. 3 is a detailed circuit diagram illustrating the buffer driver of FIG. 1.

As shown in FIG. 1, the apparatus for generating a boosted voltage according to an embodiment of the present invention includes a boosted voltage generator 100, a voltage detector 110, a buffer driver control unit 120, a buffer driver 130 and a frequency multiplier 140.

The boosted voltage generator 100 generates a second voltage V2 higher than a first voltage V1 based on a second clock signal CLK2. The second clock signal CLK2 is an inverted version of an externally provided first clock signal CLK1.

The voltage detector 110 detects the second voltage V2, and outputs to the buffer driver control unit 120 a detection signal according to the detected change in a level of the second voltage V2.

The buffer driver control unit 120 outputs to the buffer driver 130 a current control signal based on the detection signal.

The buffer driver 130 modulates a charging current that is applied to the boosted voltage generator 100 so as to maintain a constant level of the second voltage V2 based on the current control signal.

The frequency multiplier 140 modulates a frequency of the first clock signal CLK1 to reduce ripple of the second voltage V2. In this exemplary illustration, the first voltage V1 corresponds to a power supply voltage, and the second voltage V2 has a voltage level twice as large as a voltage level of the first voltage V1.

The boosted voltage generator 100 includes first and second diodes D1 and D2, a first inverter 102, a first capacitor C1, a second capacitor C2 and a switch transistor 104.

The first inverter 102 inverts the first clock signal CLK1 from the frequency multiplier 140. The first capacitor C1 is connected at one end to the first diode D1 and is connected at the opposite end to an output terminal of the first inverter 102. The second capacitor C2 is connected at one end to the second diode D2 and is connected at the opposite end to an output terminal of the buffer driver 130. The switch transistor 104 has a gate terminal connected to the first diode D1, and a source terminal connected to the second diode D2. In this exemplary embodiment, the switch transistor 104 is an NMOS transistor whose gate terminal and drain terminal are coupled together.

The boosted voltage generator 100 includes two charge pumps, referred to herein as first and second charge pumps. The first charge pump includes the first diode D1, the first inverter 102 and the first capacitor C1, and the second charge pump includes the second diode D2 and the second capacitor C2. Here, the second charge pump may include the buffer driver 130.

The first and second diodes D1, D2 may correspond to diode-connected PMOS transistors. Since a diode-connected NMOS transistor needs a triple well structure for insulating a p-well from a ground, the diode-connected PMOS transistor is employed in a preferred embodiment of the present invention to avoid a costly triple well process.

The second capacitor C2 is charged to the first voltage V1 during a time interval when a second clock signal CLK2 is high, the second clock signal CLK2 being an inverted version of the first clock signal CLK1. The second capacitor C2 is charged to the second voltage V2, whose level is twice as large as the level of the first voltage V1, during a time interval when the second clock signal CLK2 is low, and the second voltage V2 is output through the switch transistor 104.

The first capacitor C1 turns off the switch transistor 104 during the time interval when the second clock signal CLK2 is high, and turns on the switch transistor 104 during the time interval when the second clock signal CLK2 is low. The second voltage V2 is outputted through the switch transistor 104.

As shown in FIG. 2, the voltage detector 110 includes a reference signal generator 200, first through fourth resistors R1~R4 and a comparator 210.

The reference signal generator 200 generates a bandgap reference signal Vref.

The first through fourth resistors R1~R4 divide the output second voltage V2 of the boosted voltage generator 100 into first through third divided voltages Vd1, Vd2 and Vd3.

The comparator 210 compares the first through third divided voltages Vd1~Vd3 with the bandgap reference signal Vref to generate a detection signal.

Here, the bandgap reference signal Vref has a constant level regardless of a change in a temperature or a change in a process condition. The bandgap reference signal Vref according to an exemplary embodiment of the present invention is equal to 0.7V.

In addition, the comparator 210 includes a first comparator 212, a second comparator 214 and a third comparator 216.

The first comparator 212 compares the first divided voltage Vd1 with the reference signal Vref to generate a first detection signal comp1.

The second comparator 214 compares the second divided voltage Vd2 with the reference signal Vref to generate a second detection signal comp2.

The third comparator 216 compares the third divided voltage Vd3 with the reference signal Vref to generate a third detection signal comp3.

The first comparator 212 starts an operation when the second voltage V2 has a relatively low first level, the third comparator 216 starts an operation when the second voltage V2 has a relatively high second level, and the second comparator 214 starts an operation when the second voltage V2 has a third level between the first and second levels.

For example, the first comparator 212 outputs a signal having a high logic level when the second voltage V2 is greater than or equal to 5.029V, a third comparator 216 outputs a signal having a high logic level when the second voltage V2 is greater than or equal to 5.12V, and a second comparator 214 outputs a signal having a high logic level when the second voltage V2 is greater than or equal to 5.075V.

Therefore, the first through fourth resistors R1~R4 are determined to have appropriate values that cause the first comparator 212 to output a signal having a high logic level when the second voltage V2 is greater than or equal to 5.029V, that cause the third comparator 216 to output a signal having a high logic level when the second voltage 1. V2 is greater than or equal to 5.12V, and that cause the second comparator 214 to output a signal having a high logic level when the second voltage V2 is greater than or equal to 5.075V.

In addition, as shown in FIG. 3, a buffer driver 130 includes a second inverter 300 and a current controller 310.

The second inverter 300 inverts the second clock signal CLK2 provided from the first inverter 102, and applies a first charging current I1 to the second capacitor C2 when the second clock signal CLK2 is low.

The current controller 310 is selectively operated by the current control signal provided from the buffer driver control unit 120, thereby selectively applying second through fourth charging currents I2, I3 and I4 to the second capacitor C2. The current control signal includes first through third PMOS control signals CPM1, CPM2 and CPM3, and first through third NMOS control signals CNM1, CNM2 and CNM3.

The current controller 310 includes a first inverter driver 312, a second inverter driver 314 and a third inverter driver 316.

The first inverter driver 312 is selectively operated by the first PMOS control signal CPM1 and the first NMOS control signal CNM1.

The second inverter driver 314 is selectively operated by the second PMOS control signal CPM2 and the second NMOS control signal CNM2.

The third inverter driver 316 is selectively operated by the third PMOS control signal CPM3 and the third NMOS control signal CNM3.

The second inverter 300 includes a first PMOS transistor PM1 and a first NMOS transistor NM1. Gate terminals of the first PMOS transistor PM1 and the first NMOS transistor NM1 are coupled together to an output terminal of the first inverter 102. In addition, drain terminals of the first PMOS transistor PM1 and the first NMOS transistor NM1 are coupled together to the second capacitor C2.

The first inverter driver 312 includes a second PMOS transistor PM2 and a second NMOS transistor NM2. Gate terminals of the second PMOS transistor PM2 and the second NMOS transistor NM2 receive the first PMOS control signal CPM1 and the first NMOS control signal CNM1, respectively. Drain terminals of the second PMOS transistor PM2 and the second NMOS transistor NM2 are coupled together to the second capacitor C2.

The second inverter driver 314 includes a third PMOS transistor PM3 and a third NMOS transistor NM3. Gate terminals of the third PMOS transistor PM3 and the third NMOS transistor NM3 receive the second PMOS control signal CPM2 and the second NMOS control signal CNM2, respectively. Drain terminals of the third PMOS transistor PM3 and the third NMOS transistor NM3 are coupled together to the second capacitor C2.

The third inverter driver 316 includes a fourth PMOS transistor PM4 and a fourth NMOS transistor NM4. Gate terminals of the fourth PMOS transistor PM4 and the fourth NMOS transistor NM4 receive the third PMOS control signal CPM3 and the third NMOS control signal CNM3, respectively. Drain terminals of the fourth PMOS transistor PM4 and the fourth NMOS transistor NM4 are coupled together to the second capacitor C2.

The first through third inverter drivers 312, 314 and 316 are selectively driven by the first through third PMOS control signals CPM1, CPM2 and CPM3 and the first through third NMOS control signals CNM1, CNM2 and CNM3 to selectively output the second through fourth charging currents I2, I3 and I4, thereby modulating a charging current, that is applied to the second capacitor C2.

Figure 4:
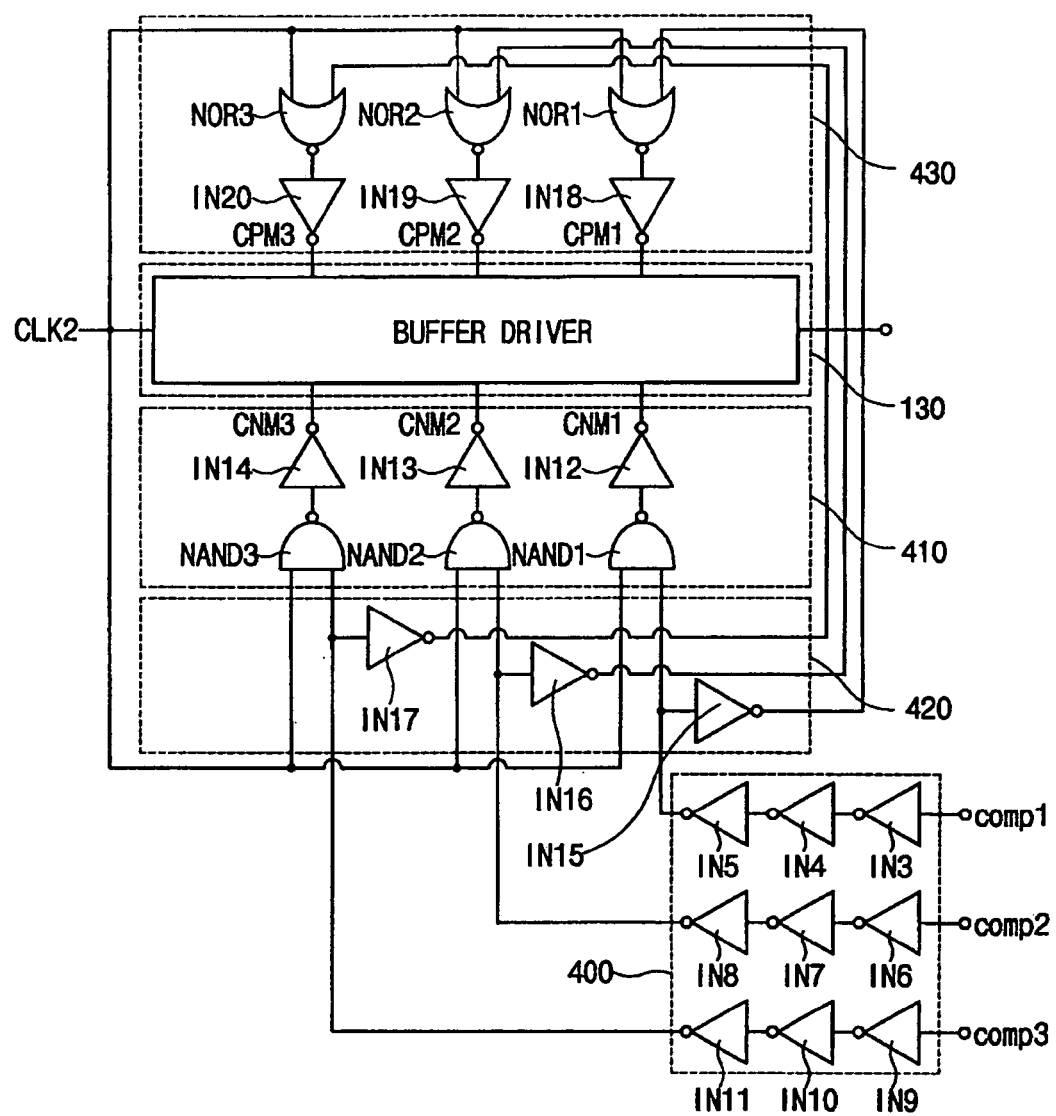
FIG. 4 is a detailed circuit diagram illustrating the buffer driver control unit of FIG. 1.

In addition, as shown in FIG. 4, the buffer driver control unit 120 includes a first inverting unit 400, a first control signal output unit 410, a second inverting unit 420 and a second control signal output unit 430.

The first inverting unit 400 inverts the first through third detection signals comp1, comp2 and comp3 that are generated from the first through third comparators 212, 214 and 216 of the voltage detector 110.

The first control signal output unit 410 is operated by the inverted first through third detection signals comp1, comp2 and comp3 of the first inverting unit 400 to output the first through third NMOS control signals CNM1, CNM2 and CNM3.

The second inverting unit 420 again inverts the inverted first through third detection signals comp1, comp2 and comp3.

The second control signal output unit 430 is operated by the again inverted first through third detection signals comp1, comp2 and comp3 of the second inverting unit 420 to output the first through third PMOS control signals CPM1, CPM2 and CPM3.

The first inverting unit 400 includes third through fifth inverters IN3, IN4 and IN5 for inverting the first detection signal comp1, sixth through eighth inverters IN6, IN7 and IN8 for inverting the second detection signal comp2, and ninth through eleventh inverters IN9, IN10 and IN11 for inverting the third detection signal comp3.

Sizes of the third through fifth inverters IN3, IN4 and IN5 increase with an increase in order, thereby amplifying the first detection signal comp1 as well as inverting the same. The first detection signal comp1 needs to be amplified while being inverted, because an operating signal of the buffer driver 130 is larger than the outputted first detection signal comp1 from the voltage detector 110.

The first control signal output unit 410 includes a first NAND gate NAND1, a second NAND gate NAND2 and a third NAND gate NAND3.

The first NAND gate NAND1 receives the first detection signal comp1 that is inverted by the third through fifth inverters IN3, IN4 and IN5, and the second clock signal CLK2. The second NAND gate NAND2 receives the second detection signal comp2 that is inverted by the sixth through eighth inverters IN6, IN7 and IN8, and the second clock signal CLK2. The third NAND gate NAND3 receives the third detection signal comp3 that is inverted by the ninth through eleventh inverters IN9, IN10 and IN11, and the second clock signal CLK2.

In addition, the first control signal output unit 410 further includes a twelfth inverter IN12, a thirteenth inverter IN13 and a fourteenth inverter IN14.

The twelfth inverter IN12 inverts an output signal of the first NAND gate NAND1 to output the first NMOS control signal CNM1. The thirteenth inverter IN13 inverts an output signal of the second NAND gate NAND2 to output the second NMOS control signal CNM2. The fourteenth inverter IN14 inverts an output signal of the third NAND gate NAND3 to output the third NMOS control signal CNM3.

The second inverting unit 420 includes a fifteenth inverter IN15, a sixteenth inverter IN16 and a seventeenth inverter IN17.

The fifteenth inverter IN15 again inverts the first detection signal comp1 that is sequentially inverted by the third through fifth inverters IN3, IN4 and IN5. The sixteenth inverter IN16 again inverts the second detection signal comp2 that is sequentially inverted by the sixth through eighth inverters IN6, IN7 and IN8. The seventeenth inverter IN17 again inverts the third detection signal comp3 that is sequentially inverted by the ninth through eleventh inverters IN9, IN10 and IN11. Therefore, the state of each output signal from the fifth through seventh inverters IN15, IN16 and IN17 is equal to the state of each of the first through third detection signals comp1, comp2 and comp3, respectively.

The second control signal output unit 430 includes a first NOR gate NOR1, a second NOR gate NOR2 and a third NOR gate NOR3.

The first NOR gate NOR1 receives the first detection signal comp1 that is again inverted by the fifteenth inverter IN15 of the second inverting unit 420. The second NOR gate NOR2 receives the second detection signal comp2 that is again inverted by the sixteenth inverter IN16 of the second inverting unit 420. The third NOR gate NOR3 receives the third detection signal comp3 that is again inverted by the seventeenth inverter IN17 of the second inverting unit 420.

In addition, the second control signal output unit 430 further includes an eighteenth inverter IN18, a nineteenth IN19 and a twentieth inverter IN20.

The eighteenth inverter IN18 inverts an output signal of the first NOR gate NOR1 to output the first PMOS control signal CPM1. The nineteenth IN19 inverts an output signal of the second NOR gate NOR2 to output the second PMOS control signal CPM2. The twentieth inverter IN20 inverts an output signal of the third NOR gate NOR3 to output the third PMOS control signal CPM3.

The buffer driver control unit 120 outputs current control signals that are the first through third PMOS control signals CPM1, CPM2 and CPM3 and the first through third NMOS control signals CNM1, CNM2 and CNM3, while increasing the second voltage V2 when the second voltage V2 detected by the voltage detector 110 is lower than a preset reference level, or decreasing the second voltage V2 when the second voltage V2 detected by the voltage detector 110 is higher than the preset reference level.

The frequency multiplier 140 controls a frequency of the first clock signal CLK1. That is, the frequency multiplier 140 increases the frequency of the first clock signal CLK1, thereby decreasing a ripple of the second voltage V2, which is generated in the boosted voltage generator 100.

Hereinafter, operation of the boosted voltage generator 100 will be described in more detail. First, an operation of generating the second voltage V2 that is a boosted voltage of the first voltage V1 is described.

The first inverter 102 inverts the externally provided first clock signal CLK1 thereby outputting a second clock signal CLK2. The second capacitor C2 is charged to the first voltage V1, when the second clock signal CLK2 is high. Here, the first NMOS transistor NM1 of the second inverter 300 in the buffer driver 130 is turned on, and the switch transistor 104 is turned off.

Subsequently, a first PMOS transistor PM1 is turned on when the second clock signal CLK2 is low, thereby charging the second capacitor with the second voltage V2 whose level is twice as large as the voltage level of the first voltage V1. In this case, a signal having a low logic level is applied to the gate terminal of the switch transistor 104, thereby turning on the switch transistor 104, and the charged voltage V2 in the second capacitor C2 is outputted through an output terminal OUTPUT of the switch transistor 104.

Operation of stabilizing the second voltage V2 is described herein below.

The level of the second voltage V2 varies depending on a load capacitor $C_{load}$ connected to the output terminal OUTPUT.

The first through third comparators 212, 214 and 216 compare the second voltage V2 to the bandgap reference signal Vref to generate the first through third detection signals comp1, comp2 and comp3.

That is, the first comparator 212 compares the first divided voltage Vd1 with the reference signal Vref to generate the first detection signal comp1, wherein the first divided voltage Vd1 is a divided voltage of the second voltage V2, being present between the first resistor R1 and the second resistor R2.

The second comparator 214 compares the second divided voltage Vd2 with the reference signal Vref to generate the second detection signal comp2, wherein the second divided voltage Vd2 is a divided voltage of the second voltage V2 being present between the second resistor R2 and the third resistor R3.

The third comparator 216 compares the third divided voltage Vd3 with the reference signal Vref to generate the third detection signal comp3, wherein the divided voltage Vd3 is a divided voltage of the second voltage V2 being present between the third resistor R3 and the fourth resistor R4.

When the second voltage V2 to be generated is 5V according to an exemplary embodiment of the present invention, the first through third comparators 212, 214 and 216 output first through third detection signals as illustrated in table 1 below.

TABLE 1

| second voltage | comparison signal | | |
|---|---|---|---|
| | COMP1 | COMP2 | COMP3 |
| V2 < 5.029 V | 0 | 0 | 0 |
| 5.029 V < V2 < 5.075 V | 1 | 0 | 0 |
| 5.075 V < V2 < 5.12 V | 1 | 1 | 0 |
| 5.12 V < V2 | 1 | 1 | 1 |

As shown in table 1, when the second voltage V2 is less than 5.029V, the first through third detection signals comp1~comp3 of the first through third comparators 212, 214 and 216 are "0". When the second voltage V2 is greater than 5.029V and less than 5.075V, the first detection signal comp1 is "1", and the second and third detections signals comp2 and comp3 are "0". When the second voltage V2 is greater than 5.075V and less than 5.12V, the first and second detection signals comp1 and comp2 are "1" and the third detection signal comp3 is "0". When the second voltage V2 is greater than 5.12V, the first through third detection signals comp1~comp3 are "1".

The buffer driver control unit 120 outputs the first through third PMOS control signals CPM1, CPM2 and CPM3 and the first through third NMOS control signals CNM1, CNM2 and CNM3 to the buffer driver 130 based on the first through third detection signals comp1, comp2 and comp3 provided from the voltage detector 110.

When all the first through third detection signals comp1, comp2 and comp3 are "0", the first through third detection signals comp1, comp2 and comp3 are inverted by the first inverting unit 400 to be applied to the first through third NAND gates NAND1, NAND2 and NAND3. That is, the first detection signal comp1 is inverted by the third through fifth inverters IN3, IN4 and IN5 to be applied to the first NAND gate NAND1 of the first control signal output unit 410. The second detection signal comp2 is inverted by the sixth through eighth inverters IN6, IN7 and IN8 to be applied to the second NAND gate NAND2 of the first control signal output unit 410. The third detection signal comp3 is inverted by the ninth through eleventh inverters IN9, IN10 and IN11 to be applied to the third NAND gate NAND3 of the first control signal output unit 410.

The first through third NANb gates NAND1, NAND2 and NAND3 output "0" when the second clock signal CLK2 is high, and output "1" when the second clock signal CLK2 is low. When the first through third NAND gates NAND1, NAND2 and NAND3 output "0", the twelfth through fourteenth inverters IN12, IN13 and IN14 output the first through third NMOS control signals CNM1, CNM2 and CNM3 having high logic levels. In addition, when the first through third NAND gates NAND1, NAND2 and NAND3 output "1", the twelfth through fourteenth inverters IN12, IN13 and IN14 output the first through third NMOS control signals CNM1, CNM2 and CNM3 having high logic levels.

That is, the first through third NMOS control signals CNM1, CNM2 and CNM3 from the twelfth through fourteenth inverters IN12, IN13 and IN14 are synchronized to the second clock signal CLK2.

The second inverting unit 420 again inverts the first through third detection signals comp1, comp2 and comp3 that are inverted by the first inverting unit 400 to be provided to the second control signal output unit 430. That is, the fifteenth inverter IN15 again inverts the first detection signal comp1 having a high logic level, thereby outputting the first detection signal comp1 having a low logic level to the first NOR gate NOR1 of the second control signal output unit 430. The sixteenth inverter IN16 again inverts the second detection signal comp2 having a high logic level, thereby outputting the second detection signal comp2 having a low logic level to the second NOR gate NOR2 of the second control signal output unit 430. The seventeenth inverter IN17 again inverts the third detection signal comp3 having a high logic level thereby outputting the third detection signal comp3 having a low logic level to the third NOR gate NOR3 of the second control signal output unit 430.

When all the first through third detection signals comp1, comp2 and comp3 of the second inverting unit 420 have low levels, the first through third NOR gates NOR1, NOR2 and NOR3 output "0" when the second clock signal CLK2 is high, and output "1" when the second clock signal CLK2 is low. When the first through third NOR gates NOR1, NOR2 and NOR3 output "0", the eighteenth through twentieth inverters IN18, IN19 and IN20 output the first through third PMOS control signals CPM1, CPM2 and CPM3 having high logic levels. In addition, when the first through third NOR gates NOR1, NOR2 and NOR3 output "1", the eighteenth through twentieth inverters IN18, IN19 and IN20 output the first through third PMOS control signals CPM1, CPM2 and CPM3 having high logic levels.

That is, the first through third PMOS control signals CPM1, CPM2 and CPM3 from the eighteenth through twentieth inverters IN18, IN19 and IN20 are synchronized to the second clock signal CLK2.

When the first detection signal comp1 is "1" and the second and third detection signals comp2 and comp3 are "0", the first detection signal comp1 is again inverted by the third through fifth inverters IN3, IN4 and IN5 of the first inverting unit 400, so that the first detection signal comp1 having a low logic level is applied to the first NAND gate NAND1. The second detection signal comp2 is again inverted by the sixth through eighth inverters IN6, IN7 and IN8 of the first inverting unit 400, so that the second detection signal having a high logic level is applied to the second NAND gate NAND2. The third detection signal comp3 is again inverted by the ninth through eleventh inverters IN9, IN10 and IN11 of the first inverting unit 400, so that the third detection signal comp3 having a low logic level is applied to the third NAND gate NAND3.

The first NAND gate NAND1 constantly outputs a signal having a high logic level regardless of a logical state of the second clock signal CLK2. The second and third NAND gates NAND2 and NAND3 output "0" when the second clock signal CLK2 is high and output "1" when the second clock signal CLK2 is low. Therefore, the twelfth inverter IN12 inverts a signal having a high logic level form the first NAND gate NAND1 to output the first NMOS control signal CNM1 having a low level. The thirteenth and fourteenth inverters IN13 and IN14 output the second and third NMOS control signals CNM2 and CNM3 having high logic levels when output signals of the second and third NAND gates NAND2 and NAND3 have low levels. In addition, the thirteenth and fourteenth inverters IN13 and IN14 output the second and third NMOS control signals CNM2 and CNM3 having high logic levels when output signals of the second and third NAND gates NAND2 and NAND3 have high levels.

That is, the first NMOS control signal CNM1 that is outputted from the twelfth inverter IN12 has a low level regardless of the second clock signal CLK2, and the second and third NMOS control signals CNM2 and CNM3 that are outputted from the thirteenth and fourteenth inverters IN13 and IN14 are synchronized to the second clock signal CLK2.

When the first detection signal comp1 is "1" and the second and third detection signals comp2 and comp3 are "0", the first detection signal comp1, which is inverted by the third through fifth inverters IN3, IN4 and IN5 of the first inverting unit 400 and thereby having a low level, is also provided to the fifteenth inverter IN15 of the second inverting unit 420. The fifteenth inverter IN15 again inverts the first detection signal comp1 to output the first detection signal comp1 having a high logic level to the first NOR gate NOR1.

The sixteenth inverter IN16 of the second inverting unit 420 again inverts the second detection signal comp2, which is inverted by the sixth through eighth inverters IN6, IN7 and IN8 of the first inverting unit 400 and thereby having a high level, so that the again inverted second detection signal comp2 having a low logic level is outputted to the second NOR gate NOR2.

The seventeenth inverter IN17 of the second inverting unit 420 again inverts the third detection signal comp3, which is inverted by the ninth through eleventh inverters IN9, IN10 and IN11 of the first inverting unit 400 and thereby having a high level, so that the again inverted third detection signal comp3 having a low logic level is outputted to the third NOR gate NOR3.

The first NOR gate NOR1 outputs a signal having a low logic level regardless of a logical state of the second clock signal CLK2. The second and third NOR gates NOR2 and NOR3 output "1" when the second clock signal CLK2 is high, and output "0" when the second clock signal CLK2 is low. The eighteenth inverter IN18 inverts the low level signal of the first NOR gate NOR1 to output the first PMOS control signal CPM1 having a high level. The nineteenth and twentieth inverters IN19 and IN20 output the second and third PMOS control signals CPM2 and CPM3 having high logic levels when output signals of the second and third NOR gates NOR2 and NOR3 have low levels. In addition, the nineteenth and twentieth inverters IN19 and IN20 output the second and third PMOS control signals CPM2 and CPM3 having high logic levels when output signals of the second and third NOR gates NOR2 and NOR3 have high levels.

That is, the first PMOS control signal CPM1 that is outputted from the eighteenth inverter IN18, has a low logic level regardless of the second clock signal CLK2, and the second and third PMOS control signals CPM2 and CPM3 that are outputted from the nineteenth and twentieth inverters IN19 and IN20 are synchronized to the second clock signal CLK2.

As described above, when the first and second detection signals comp1 and comp2 are "1" and the third detection signal comp3 is "0", the first and second NMOS control signals CNM1 and CNM2 are. "0" regardless of the second clock signal CLK2, and the third NMOS control signal CNM3 is synchronized to the second clock signal CLK2. In addition, the first and second PMOS control signals CPM1 and CPM2 are "1" regardless of the second clock signal CLK2, and the third PMOS control signal CPM3 is synchronized to the second clock signal CLK2.

When all the first through third detection signals comp1, comp2 and comp3 are "1", the first through third NMOS control signals CNM1, CNM2 and CNM3 are "0" and the first through third PMOS control signals CPM1, CPM2 and CPM3 are "1".

TABLE 2

| comp 1, 2, 3 | CNM1 | CNM2 | CNM3 | CPM1 | CPM2 | CPM3 |
|---|---|---|---|---|---|---|
| 0, 0, 0 | | | CLK2 | | | |
| 1, 0, 0 | 0 | | CLK2 | 1 | | CLK2 |
| 1, 1, 0 | 0 | 0 | CLK2 | 1 | 1 | CLK2 |
| 1, 1, 1 | 0 | 0 | 0 | 1 | 1 | 1 |

As shown in table 2, when all the first through third detection signals comp1, comp2 and comp3 are "0", all the first through third NMOS control signals CNM1, CNM2 and CNM3 and the first through third PMOS control signals CPM1, CPM2 and CPM3 are synchronized to the second clock signal CLK2.

When the first detection signal comp1 is "1", and the second and third detection signals comp2 and comp3 are "0", the first NMOS control signal CNM1 has a low level and the first PMOS control signal CPM1 has a high level. The second and third NMOS control signals CNM2 and CNM3 and the second and third PMOS control signals CPM2 and CPM3 are synchronized to the second clock signal CLK2.

When the first and second detection signals comp1 and comp2 are "1", and the third detection signal comp3 is "0", the first and second NMOS control signals CNM1 and CNM2 have low logic levels and the first and second PMOS control signals CPM1 and CPM2 have high logic levels. The third NMOS control signal CNM3 and the third PMOS control signal CPM3 are synchronized to the second clock signal CLK2.

When the first through third detection signals comp1, comp2 and comp3 are "1", the first through third NMOS control signals CNM1, CNM2 and CNM3 have low logic levels and the first through third PMOS control signals CPM1, CPM2 and CPM3 have high logic levels.

The first through third inverter drivers 312, 314 and 316 of the buffer driver 130 are selectively operated in response to the first through third NMOS control signals CNM1, CNM2 and CNM3 and the first through third PMOS control signals CPM1, CPM2 and CPM3, thereby modulating a charging current applied to the opposite end of the second capacitor C2.

As shown in table 3 below, when the second voltage is less than 5.029V, the first through third NMOS control signals CNM1, CNM2 and CNM3 and the first through third PMOS control signals CPM1, CPM2 and CPM3 are synchronized to the second clock signal CLK2. Therefore, when the second clock signal CLK2 is low, the second through fourth PMOS transistors PM2, PM3 and PM4 of the first through third inverter drivers 312, 314 and 316 are turned on and the second through fourth NMOS transistors NM2, NM3 and NM4 are turned off. In addition, the first PMOS transistor PM1 of the second inverter 300 is also turned on, and the first NMOS transistor NM1 is turned off. Therefore, the first through fourth charging currents I1~I4 that are outputted from the second inverter 300 and the first through third inverter drivers 312, 314 and 316, are all applied to the second capacitor C2.

TABLE 3

| | transistor | | | | | |
|---|---|---|---|---|---|---|
| second voltage | CNM1 | CNM2 | CNM3 | CPM1 | CPM2 | CPM3 |
| V2 < 5.029 V | | | CLK2 | | | |
| 5.029 V < V2 < 5.075 V | 0 | | CLK2 | 1 | | CLK2 |
| 5.075 V < V2 < 5.12 V | 0 | 0 | CLK2 | 1 | 1 | CLK2 |
| 5.12 V < V2 | 0 | 0 | 0 | 1 | 1 | 1 |

When the second voltage V2 is greater than 5.029V and less than 5.075V, the first NMOS control signal CNM1 is "0" and the first PMOS control signal CPM1 is "1". The second and third NMOS control signals CNM2 and CNM3 and the second and third PMOS control signals CPM2 and CPM3 are synchronized to the second clock signal CLK2.

Accordingly, the second PMOS transistor PM2 and the second NMOS transistor NM2 of the first inverter driver 312 are turned off regardless of the second clock signal CLK2.

The third and fourth PMOS transistors PM3 and PM4 of the second and third inverter drivers 314 and 316 are turned on when the second clock signal CLK2 is low. The first PMO transistor PM1 of the second inverter 300 is also turned on.

Therefore, only the first through third charging currents I1~I3 that are generated by the second inverter 300 and the second and third inverter drivers 314 and 316, are applied to the second capacitor C2 while the fourth charging current I4 of the first inverter driver 312 is not applied thereto, thereby the second voltage V2 is decreased in level.

When the second voltage V2 is greater than 5.075V and less than 5.12V, the first and second NMOS control signals CNM1 and CNM2 are "0" and the first and second PMOS control signals CPM1 and CPM2 are "1". The third NMOS control signal CNM3 and the third PMOS control signal CPM3 are synchronized to the second clock signal CLK2.

Accordingly, the second and third PMOS transistors PM2 and PM3 and the second and third NMOS transistors NM2 and NM2 of the first and second inverter drivers 312 and 314 are turned off regardless of the second clock signal CLK2. The fourth PMOS transistor PM4 of the third inverter driver 316 is turned on when the second clock signal CLK2 is low. The first PMO transistor PM1 of the second inverter 300 is also turned on.

Therefore, only the first and second charging currents I1 and I2 that are generated by the second inverter 300 and the third inverter driver 316, are applied to the second capacitor C2 while the third and fourth charging currents I3 and I4 generated by the first and second inverter drivers 312 and 314 are not applied thereto, thereby the level of the second voltage V2 is decreased.

In addition, when the second voltage V2 is greater than 5.12V, the first through third NMOS control signals CNM1, CNM2 and CNM3 have low logic levels and the first through third PMOS control signals CPM1, CPM2 and CPM3 have high logic levels.

Accordingly, the second through fourth PMOS transistors PM2, PM3 and PM4 and the second through fourth NMOS transistors NM2, NM3 and NM4 of the first through third inverter drivers 312, 314 and 316 are turned off regardless of the second clock signal CLK2. The first PMOS transistor PM1 of the second inverter 300 is turned on when the second clock signal CLK2 is low.

Therefore, only the first charging current I1 generated by the second inverter 300 is applied to the second capacitor C2 while the first through fourth charging currents I2~I4 generated by the first through third inverter drivers 312, 314 and 316 are not applied thereto, thereby the level of the second voltage V2 is decreased.

As described above, the first through third inverter drivers 312, 314 and 316 are selectively operated according to the level of the second voltage V2, thereby modulating a charging current applied to the second capacitor C2 so that the second voltage V2 is adjusted to a constant level.

The second through fourth PMOS transistors PM2, PM3 and PM4 are sequentially turned on or turned off in response to the first through third PMOS control signals CPM1, CPM2 and CPM3. That is, the second through fourth PMOS transistors PM2, PM3 and PM4 operate in response to a thermometer code.

In addition, the second through fourth NMOS transistors NM2, NM3 and NM4 are sequentially turned on or turned off in response to the first through third NMOS control signals CNM1, CNM2 and CNM3. That is, the second through fourth NMOS transistors NM2, NM3 and NM4 operate in response to the thermometer code.

The frequency multiplier 140 modulates a frequency of the first clock signal CLK1 to decrease a ripple of the second voltage V2.

Figure 5:
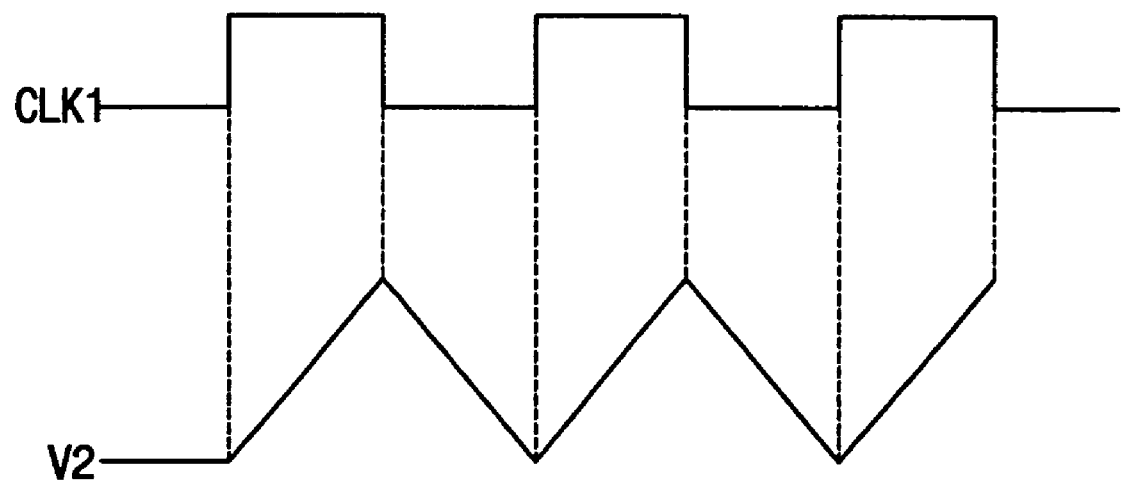
FIG. 5 is a plan view representing ripple reduction of a second voltage according to a frequency of a clock signal.
Figure 5:
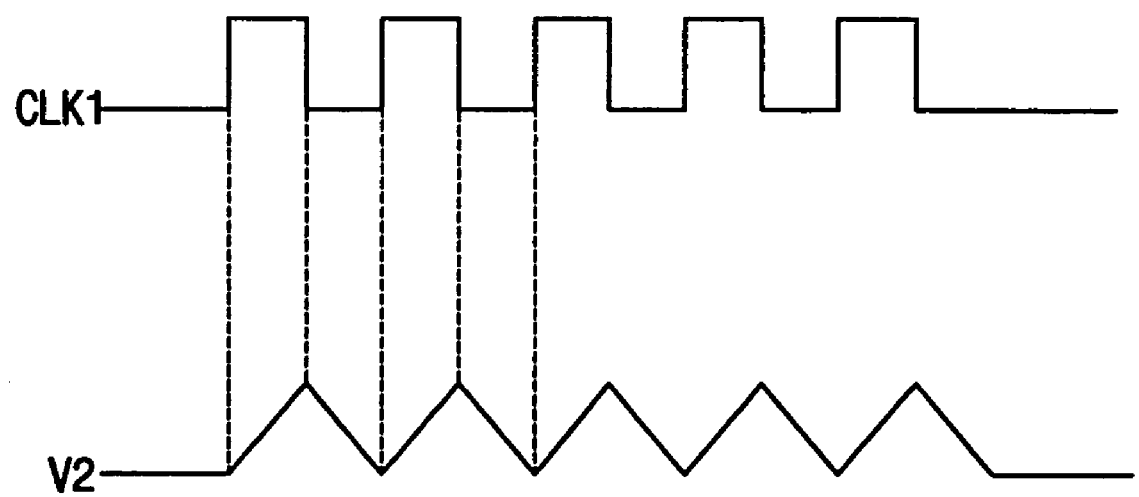

FIG. 5 is a plan view representing ripple reduction of a second voltage according to a frequency of a clock signal.

As shown in FIG. 5, as the frequency of the first clock signal CLK1 increases, the ripple amplitude in the second voltage V2 is reduced.

Therefore, the frequency multiplier 140 increases the frequency of the first clock signal CLK1 to reduce ripple in the second voltage V2.

Figure 6:
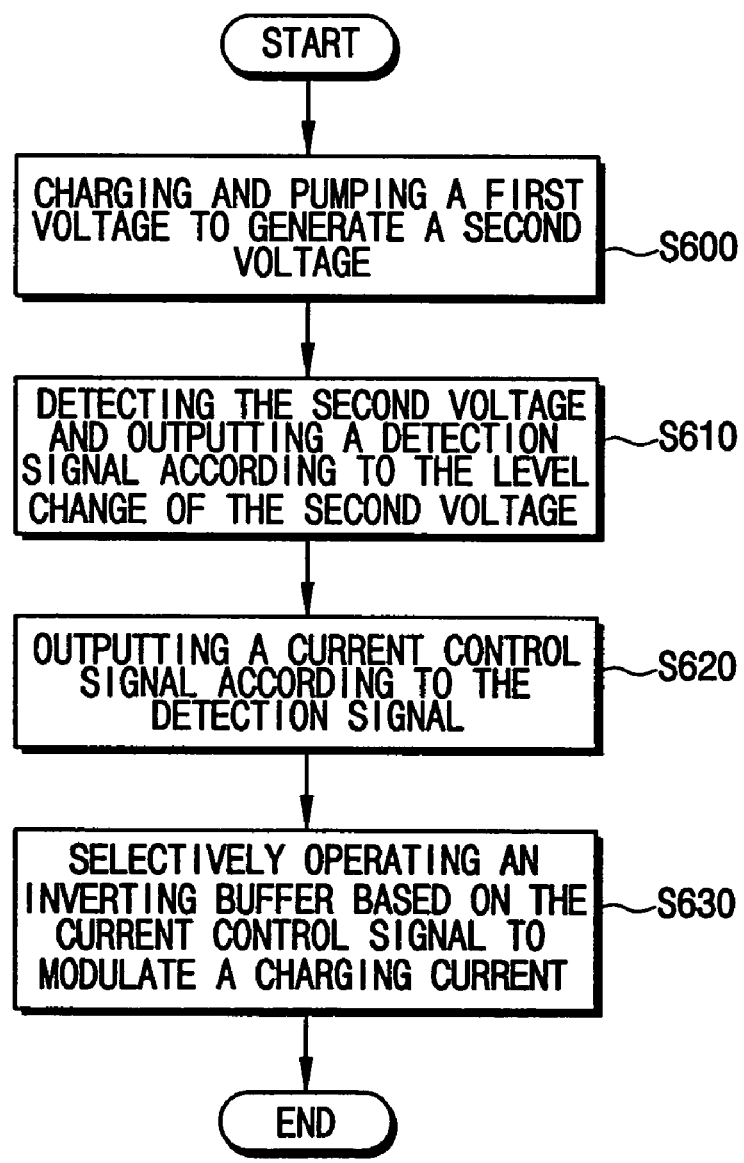
FIG. 6 is a flowchart illustrating a process of generating a boosted voltage according to an embodiment of the present invention.

FIG. 6 is a flowchart illustrating a process of generating a boosted voltage according to an embodiment of the present invention.

Referring to FIG. 6, in step S600, the second capacitor C2 of the boosted voltage generator 100 is charged to the first voltage V1 during a time interval when the second clock signal CLK2 is high, the second clock signal CLK2 being an inverted first clock signal CLK1.

The first voltage is pumped up to the second voltage V2 whose level is twice as large as the voltage level of the first voltage V1 to be outputted during a time interval when the second clock signal CLK2 is low.

In step S610, the voltage detector 110 detects the output second voltage V2 to output detection signals comp1, comp2 and comp3 according to a change in the level of the detected second voltage V2. In step S620, the buffer driver control unit 120 outputs current control signals CNM1~CNM3, CPM1~CPM3 based on the detection signals comp1, comp2 and comp3.

In step S630, the first through third inverter drivers 312, 314 and 316 of the buffer driver 130 are selectively operated based on the output current control signals CNM1~CNM3, CPM1~CPM3, thereby modulating a charging current.

Therefore, the second voltage V2 may adjust to a constant level by the modulated charging current.

Figure 7:
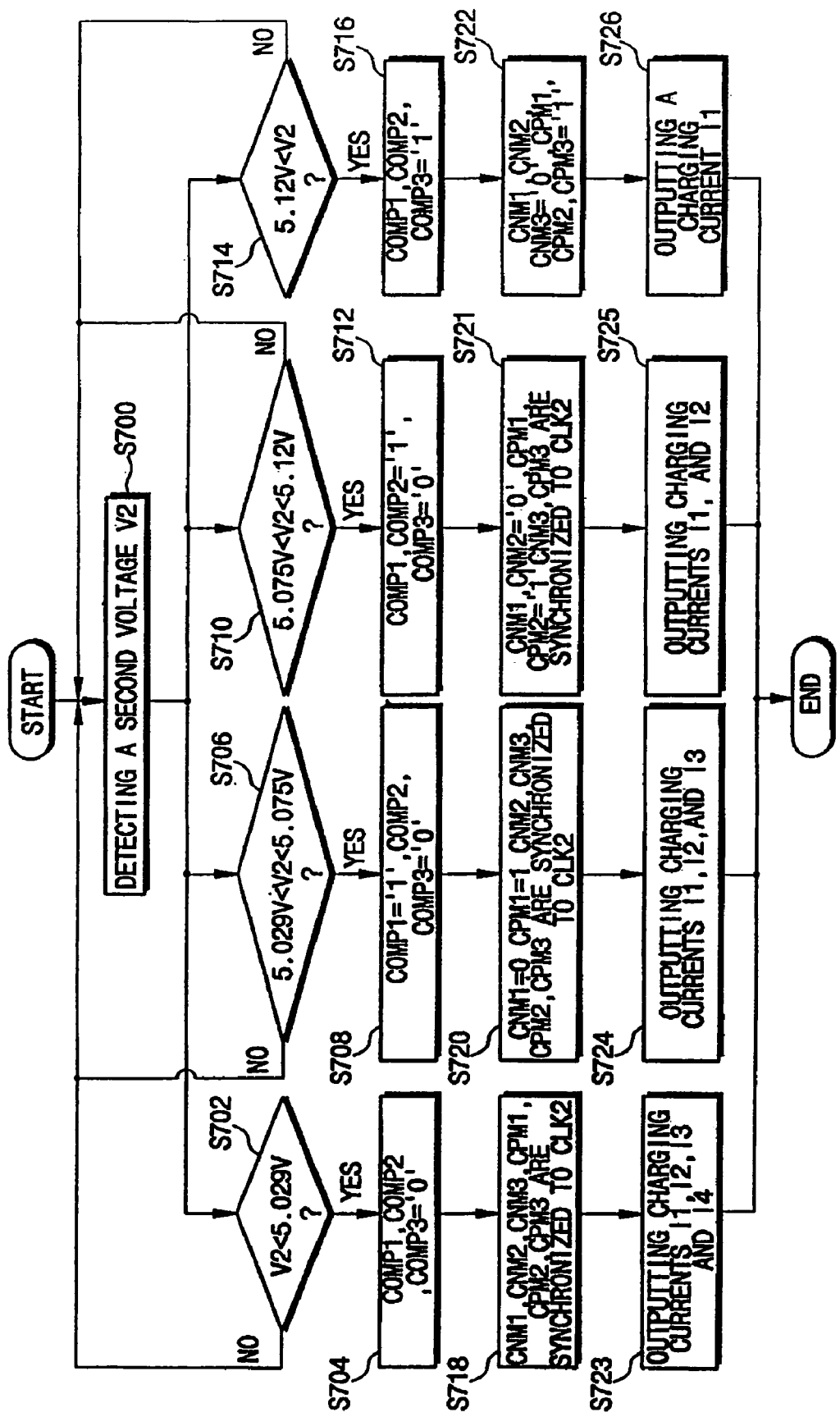
FIG. 7 is a flowchart illustrating processes of detecting a second voltage and modulating a charging current shown in FIG. 6 in detail.

FIG. 7 is a flowchart illustrating processes of detecting a second voltage and modulating a charging current shown in FIG. 6 in detail.

First, the voltage detector 110 detects the second voltage V2 (step S700).

Whether the detected voltage V2 is less than 5.029V is determined (step S702), and if the detected voltage V2 is less than 5.029V, the voltage detector 110 outputs the first through third detection signals comp1, comp2 and comp3 having low logic levels (step S704).

If the detected voltage V2 is greater than 5.029V and less than 5.075V (step S706), the voltage detector 110 outputs the first detection signal comp1 having a high logic level and the second and third detection signals comp2 and comp3 having low logic levels (step S708).

If the detected voltage V2 is greater than 5.075V and less than 5.12V (step S710), the voltage detector 110 outputs the first and second detection signals comp1 and comp2 having high logic levels and the third detection signal comp3 having a low logic level (step S712).

If the detected voltage V2 is greater than 5.12V (step S714), the voltage detector 110 outputs the first through third detection signals comp1, comp2 and comp3 having high logic levels (step S716).

When the first through third detection signals comp1, comp2 and comp3 have low levels at the step S704, the buffer driver control unit 120 outputs the first through third NMOS control signals CNM1, CNM2 and CNM3 and the first through third PMOS control signals CPM1, CPM2 and CPM3, which are synchronized to the second clock signal CLK2 (step S718).

When the first detection signal comp1 has a high level and the second and third detection signals comp2 and comp3 have low levels at the step S708, the buffer driver control unit 120 outputs the first NMOS control signal CNM1 having a low logic level and the first PMOS control signal CPM1 having a high level. The buffer driver control unit 120 also outputs the second and third NMOS control signals CNM2 and CNM3 and the second and third PMOS control signals CPM2 and CPM3, which are synchronized to the second clock signal CLK2 (step S720).

When the first and second detection signals comp1 and comp2 have high levels and the third detection signal comp3 has a low level at the step S712, the buffer driver control unit 120 outputs the first and second NOMS control signals CNM1 and CNM2 having high logic levels and the first and second PMOS control signals CPM1 and CPM2 having high logic levels. The buffer driver control unit 120 also outputs the third NMOS control signal CNM3 and the third PMOS control signal CPM3, which are synchronized to the second clock signal CLK2 (step S721).

When the first through third detection signals comp1, comp2 and comp3 have high levels at the step S716, the buffer driver control unit 120 outputs the first through third NMOS control signals CNM1, CNM2 and CNM3 and the first through third PMOS control signals CPM1, CPM2 and CPM3 having high logic levels (step S722).

Next, when the first through third NMOS control signals CNM1, CNM2 and CNM3 and the first through third PMOS control signals CPM1, CPM2 and CPM3 are synchronized to the second clock signal CLK2 at the step S718, all the first through fourth charging currents I1~I4 are applied to the second capacitor C2 by the second inverter 300 and the first through third inverter drivers 312, 314 and 316 of the buffer driver 130 (step S723).

When the first NMOS control signal CNM1 has a low level, and the first PMOS control signal CPM1 has a high level, and the second and third NMOS control signals CNM2 and CNM3 and the second and third PMOS control signals CPM2 and CPM3 are synchronized to the second clock signal CLK2 at the step of S720, only the first through third charging currents I1~I3 are applied to the second capacitor C2 by the second inverter 300 and the second and third inverter drivers 314 and 316 of the buffer driver 130 (step S724).

When the first and second NOMS control signals CNM1 and CNM2 have low levels, and the first and second PMOS control signals CPM1 and CPM2 have high levels and the third NMOS control signal CNM3 and the third PMOS control signal CPM3 are synchronized to the second clock signal CLK2 at the step S721, only the first and second charging currents I1 and I2 are applied to the second capacitor C2 by the second inverter 300 and the third inverter drivers 316 of the buffer driver 130 (step S725).

When the first through third NMOS control signals CNM1, CNM2 and CNM3 have low logic levels and the first through third PMOS control signals CPM1, CPM2 and CPM3 have high levels at the step S722, only the first charging current I1 is applied to the second capacitor C2 by the second inverter 300 of the buffer driver 130 (step S726).

As described above, the charging currents that are modulated decrease with an increase of the second voltage V2, thereby maintaining a constant level of the second voltage V2.

Although the buffer driver having three inverter drivers is described by way of example herein, the number of inverter drivers in the buffer driver of the present invention may vary.

For example, the buffer driver may have two inverter drivers, and the voltage detector may have two comparators accordingly.

The greater the number of inverter drivers the buffer driver has, the more sensitively the change in the level of the second voltage V2 may be detected and controlled, however, efficiency of operation of a boosted voltage generating apparatus may decrease. Therefore, the buffer driver may preferably have three inverter drivers.

While this invention has been particularly shown and described with reference to exemplary embodiments thereof, it will be understood by those of ordinary skill in the art that various changes in form and details may be made therein without departing from the spirit and scope of the invention as defined by the following claims.

What is claimed is:

1. An apparatus for generating and stabilizing a boosted voltage comprising:
   a boosted voltage generator configured to output the boosted voltage higher than a power supply voltage in response to a clock signal;
   a voltage detector configured to detect a change in a level of the boosted voltage and configured to output first through N-th detection signals corresponding to the detected change;
   a buffer driver control unit configured to generate first through 2N-th current control signals based on the first through N-th detection signals; and
   a buffer driver including first through N-th inverter drivers that are configured to be selectively operated to modulate a charging current for generating the boosted voltage, based on the first through 2N-th current control signals.

2. The apparatus of claim 1, wherein the voltage detector includes:
   a reference voltage generator for generating a reference voltage;
   first through (N+1)-th resistors for dividing the boosted voltage to generate first through N-th divided voltages; and
   first through N-th comparators for comparing the first through N-th divided voltages with the reference voltage to output the first through N-th detection signals.

3. The apparatus of claim 1, wherein the first through 2N-th current control signals include first through N-th NMOS control signals and first through N-th PMOS control signals, and the first through N-th PMOS control signals correspond to the first through N-th NMOS control signals, respectively.

4. The apparatus of claim 3, wherein the first through N-th NMOS control signals are reversed signals of the corresponding first through N-th PMOS control signals.

5. The apparatus of claim 3, wherein the buffer driver control unit includes:
   a first inverting unit configured to invert and amplify the first through N-th detection signals;
   a first control signal output unit configured to output the first through N-th NMOS control signals in response to the first through N-th detection signals that are inverted by the first inverting unit;
   a second inverting unit configured to secondly invert the inverted first through N-th detection signals; and
   a second control signal output unit configured to output the first through N-th PMOS control signals in response to the first through N-th detection signals that are secondly inverted by the second inverting unit.

6. The apparatus of claim 5, wherein the first control signal output unit includes:
- first through N-th NAND gates configured to provide a logical NAND of the inverted first through N-th detection signals and the clock signal; and
- first through N-th inverters configured to invert output signals of the first through N-th NAND gates to output the first through N-th NMOS control signals.

7. The apparatus of claim 5, wherein the second control signal output unit includes:
- first through N-th NOR gates configured to provide a logical NOR of the again inverted first through N-th detection signals and the clock signal; and
- first through N-th inverters configured to invert output signals of the first through N-th NAND gates, thereby outputting the first through N-th NMOS control signals.

8. The apparatus of claim 3, wherein the buffer driver includes a first inverter configured to operate synchronously with the clock signal and output a first charging current, and the first through N-th inverter drivers are selectively operated in response to the first through 2N-th current control signals to selectively output second through N+1-th charging currents.

9. The apparatus of claim 8, wherein the first inverter includes:
- a first transistor having a gate terminal to which the clock signal is applied and a source terminal to which the power supply voltage is applied, and a drain terminal that is configured to output the first charging current; and
- a second transistor having a gate terminal to which the clock signal is applied, a source terminal connected to a ground and a drain terminal connected to a drain terminal of a PMOS transistor.

10. The apparatus of claim 8, wherein the first through N-th inverter driver includes:
- first through N-th PMOS transistors having gate terminals to which the first through N-th PMOS control signals are applied, respectively, and source terminals to which the power supply voltage is applied, and configured to selectively operate in response to the first through N-th PMOS control signals to output the second through N+1-th charging currents through drain terminals thereof, respectively; and
- first through N-th NMOS transistors having gate terminals to which the first through N-th NMOS control signals are applied, respectively, and source terminals that are grounded, and drain terminals that are connected to corresponding drain terminals of the first through N-th PMOS transistors.

11. The apparatus of claim 1, wherein N is 4.

12. The apparatus of claim 1, further including a frequency multiplier for modulating a frequency of the clock signal.

13. An apparatus for stabilizing a boosted voltage comprising:
- a boosted voltage generator configured to output the boosted voltage higher than a power supply voltage in response to a clock signal;
- a voltage detector configured to detect a change in a level of the boosted voltage and configured to output first through N-th detection signals according to the detected change;
- a buffer driver control unit configured to output first through 2N-th current control signals based on the first through N-th detection signals; and
- a buffer driver including first through N-th inverter drivers that are configured to operate selectively in response to the first through 2N-th current control signals, thereby modulating a charging current that is applied to the boosted voltage generator.

14. The apparatus of claim 13, wherein the boosted voltage generator includes:
- a first capacitor configured to be charged to the boosted voltage when the first clock signal is high;
- a switch transistor configured to be turned on when the first clock signal is low, and configured to output the charged boosted voltage of the first capacitor;
- a second capacitor configured to maintain a turned-off state of the switch transistor when the first clock signal is high;
- first and second diodes configured to apply the power supply voltages to the first and second capacitors, respectively.

15. The apparatus of claim 14, wherein the first and second diodes correspond to diode-connected PMOS transistors.

16. A method of generating and stabilizing a boosted voltage comprising:
- outputting the boosted voltage higher than a power supply voltage by a clock signal;
- detecting a change in a level of the boosted voltage to output first through N-th detection signals according to the detected change;
- outputting first through 2N-th current control signals based on the first through N-th detection signals; and
- modulating a charging current for generating the boosted voltage in response to the first through 2N-th current control signals.

17. The method of claim 16, wherein the detecting the change in the level of the boosted voltage includes:
- generating first through N-th divided voltages by dividing the boosted voltage; and
- outputting the first through N-th detection signals by comparing the first through N-th divided voltages with a predetermined reference voltage.

18. The method of claim 16, wherein the first through 2N-th current control signals include first through N-th NMOS control signals and first through N-th PMOS control signals, and the first through N-th PMOS control signals are inverted signals of the corresponding first through N-th NMOS control signals.

19. The method of claim 18, wherein outputting the first through 2N-th current control signals includes:
- inverting and amplifying the first through N-th detection signals; and
- outputting the first through N-th NMOS control signals in response to the inverted first through N-th detection signals, and secondly inverting the inverted first through N-th detection signals to output the first through N-th PMOS control signals in response to the secondly inverted first through N-th detection signals.

20. The method of claim 18, wherein the charging current is modulated by selectively outputting first through N+1th charging currents in response to the first through N-th NMOS control signals and the first through N-th PMOS control signals.

21. The method of claim 16, further comprising modulating a frequency of the clock signal.

22. A method of generating a boosted voltage comprising:
- outputting the boosted voltage higher than a power supply voltage by a clock signal;

detecting a change in a level of the boosted voltage to output first through N-th detection signals according to the detected change;
outputting first through 2N-th current control signals based on the first through N-th detection signals; and
modulating a charging current that is applied to a generator of the boosted voltage in response to the first through 2N-th current control signals.

23. The method of claim 22, further comprising modulating a frequency of the clock signal.

24. A boost circuit comprising:
a first charge pump configured to pump up a first node in response to a first clock signal;
a second charge pump configured to have a current driving capability that varies depending on a feedback signal, and configured to pump up a second node in response to a second clock signal, the second clock signal being an inverted signal of the first clock signal;
an output switch configured to switch an output capacitor by a charged voltage signal in the second node in response to a voltage signal of the first node;
a voltage stabilizing unit configured to generate the feedback signal while increasing the capacitor voltage when the capacitor voltage is lower than a reference level, or decreasing the capacitor voltage when the capacitor voltage is higher than the reference level.

25. The boost circuit of claim 24, wherein the first charge pump includes:
a first inverter for inverting a clock signal;
a p+/n− diode connected between a power supply voltage and the first node;
a capacitor connected between the first node and an output terminal of the first inverter.

26. The boost circuit of claim 25, wherein the second charge pump includes:

a second inverter for inverting a clock signal that is inverted by the first inverter;
a p+/n− diode connected between the power supply voltage and the second node;
a capacitor connected between the second node and an output terminal of the second inverter; and
a buffer driver connected to the output terminal the second inverter, and having a current driving capability that varies depending on the feedback signal.

27. The boost circuit of claim 26, wherein the buffer driver includes:
a plurality of PMOS transistors connected between the power supply voltage and the output terminal of the second inverter in parallel, and configured to turn on to a thermometer code in response to a first feedback signal; and
a plurality of NMOS transistors connected between a ground voltage and the output terminal of the second inverter in parallel, and configured to turn on to a thermometer code in response to a second feedback signal.

28. The boost circuit of claim 27, wherein the voltage stabilizing unit includes:
a voltage detector configured to detect the capacitor voltage by a plurality of detection signals;
a first signal generator configured to generate a first feedback signal that is synchronized to the inverted clock signal, in response to the plurality of detection signals; and
a second signal generator configured to generate a second feedback signal that is synchronized to the inverted clock signal, in response to the plurality of detection signal.

* * * * *